United States Patent [19]

Trenary

[11] Patent Number: 4,965,865
[45] Date of Patent: Oct. 23, 1990

[54] PROBE CARD FOR INTEGRATED CIRCUIT CHIP

[75] Inventor: Dale T. Trenary, San Jose, Calif.

[73] Assignee: General Signal Corporation, Stamford, Conn.

[21] Appl. No.: 255,779

[22] Filed: Oct. 11, 1989

[51] Int. Cl.⁵ .................... G01R 31/02; G01R 1/06
[52] U.S. Cl. ........................... 324/158 P; 324/158 F
[58] Field of Search ............. 324/72.5, 158 P, 158 F, 324/73 PC; 439/482

[56] References Cited

U.S. PATENT DOCUMENTS

| | | | |
|---|---|---|---|
| 3,648,960 | 3/1972 | Conley, Jr. et al. | 254/116 |
| 3,678,385 | 7/1972 | Bruner | 324/158 F |
| 3,812,311 | 5/1974 | Kvaternik | 324/158 P |
| 3,835,381 | 9/1974 | Garretson et al. | 324/158 P |
| 4,026,412 | 5/1977 | Henson | 324/158 F |
| 4,045,737 | 8/1977 | Coberly | 324/158 P |
| 4,329,642 | 5/1982 | Luthi et al. | 324/158 F |
| 4,563,640 | 1/1986 | Hasegawa | 324/158 F |
| 4,599,559 | 7/1986 | Evans | 324/158 P |
| 4,618,821 | 10/1986 | Lenz | 324/72.5 |
| 4,757,256 | 7/1988 | Whann | 324/158 P |

OTHER PUBLICATIONS

"New Probe Cards Replace Needle Type"; Semiconductor International; Aug. 1988; pp. 98–101.

Primary Examiner—Reinhard J. Eisenzopf
Assistant Examiner—Vinh P. Nguyen
Attorney, Agent, or Firm—Ellsworth R. Roston; Charles H. Schartz Schwartz; Joseph P. Abate

[57] ABSTRACT

A probe card provides an interconnection between pads on an integrated circuit chip and leads on a printed circuit board to test the chip operability. The card includes a dielectric substrate having a substantially planar surface and at least one channel disposed in such surface in a particular direction. Electrically conductive material is disposed in the channel to contact a conductive, preferably resilient, probe having a first portion disposed in the channel in abutting relationship with the planar surface on the support. Detents are provided in mating relationship in the channel and on the support to position the probe precisely in the channel. A second probe portion extends from the first portion at an angle to the first portion. A probe tip is at the end of the second portion to contact a pad on the chip. Additional detents may be provided on the support, either (a) in or (b) displaced from the channel and on the first portion of the probe to facilitate the precise positioning of the probe in the particular direction. A first electrical contact may be disposed on the planar surface of the support to engage a second contact on the second portion of the probe when the probe tip engages the chip pad with a particular force. The probe may be extended between the planar and opposite surfaces of the probe to provide a connector terminal for passing large currents through the probe. A spring terminal may also be coupled to the support to engage the probe and an associated lead on the board at opposite ends.

17 Claims, 4 Drawing Sheets

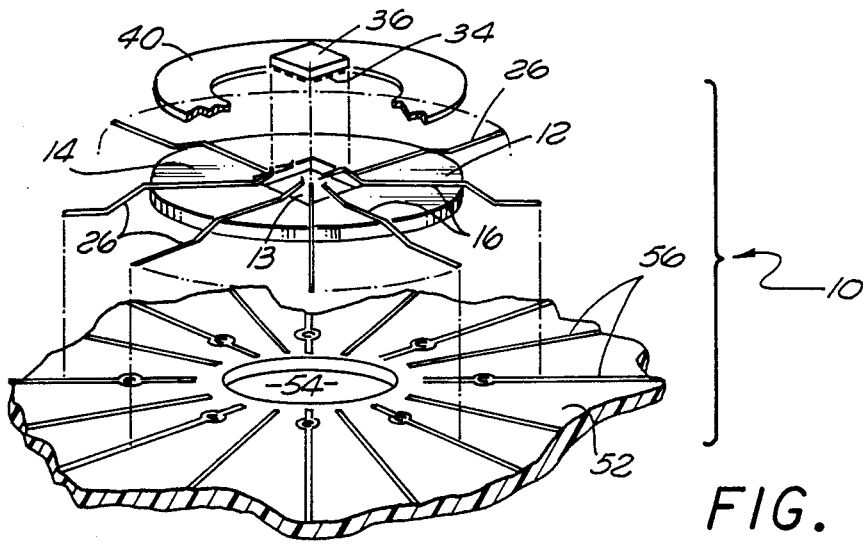
FIG. 1
FIG. 2
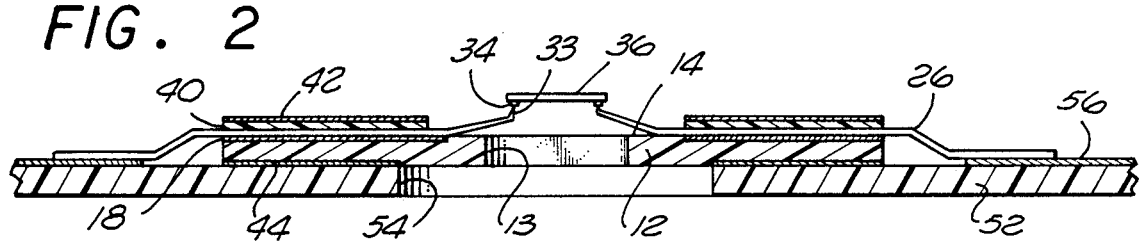
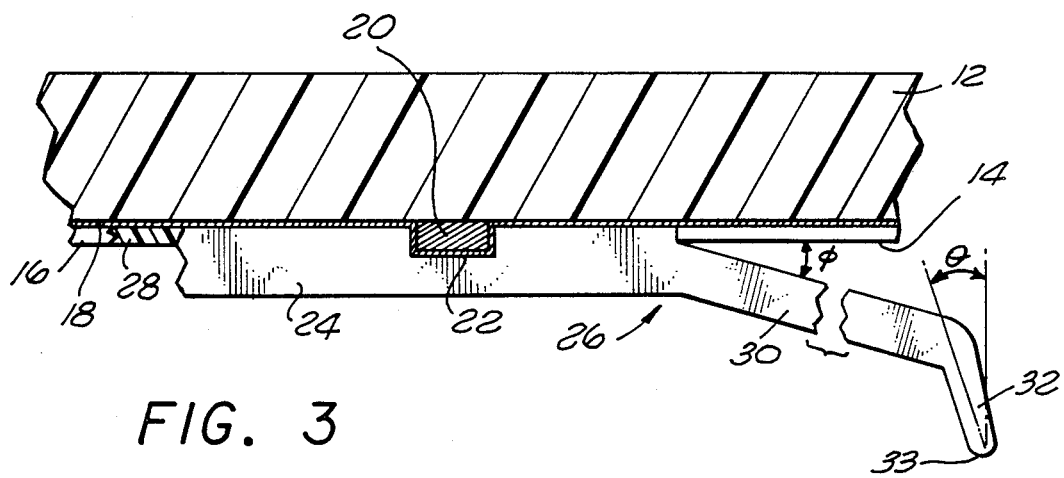
FIG. 3
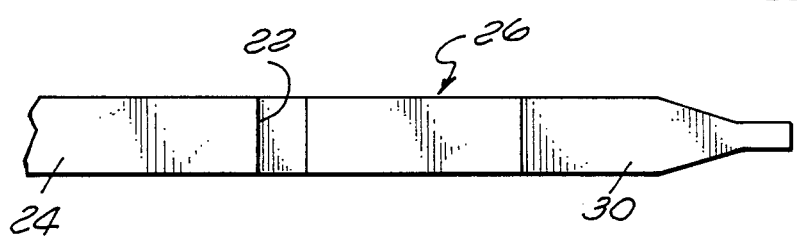
FIG. 4

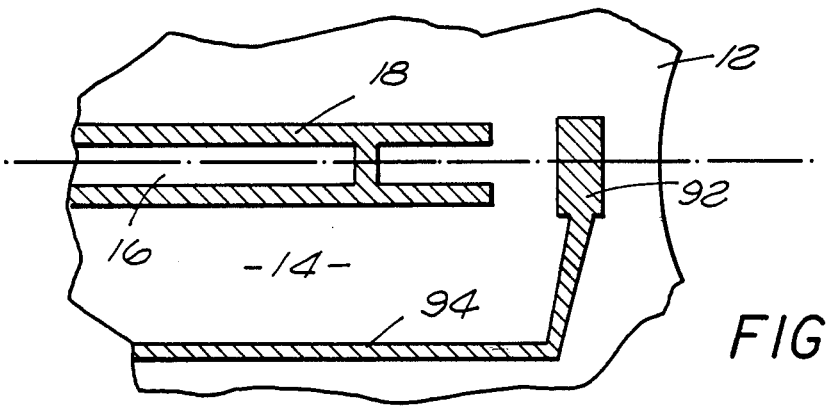
FIG. 12
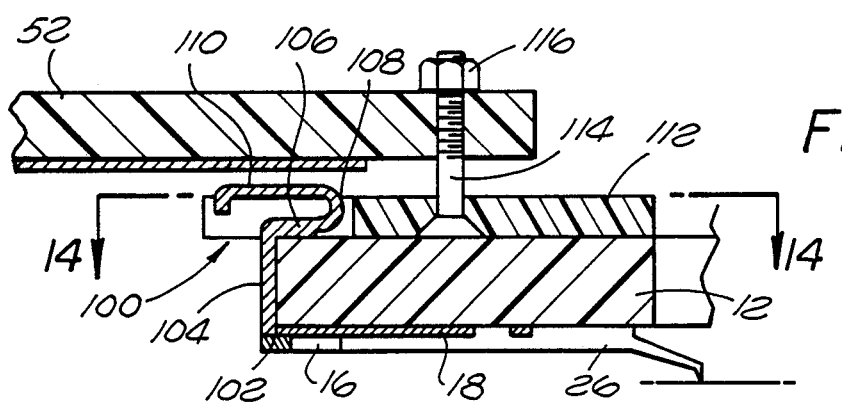
FIG. 13
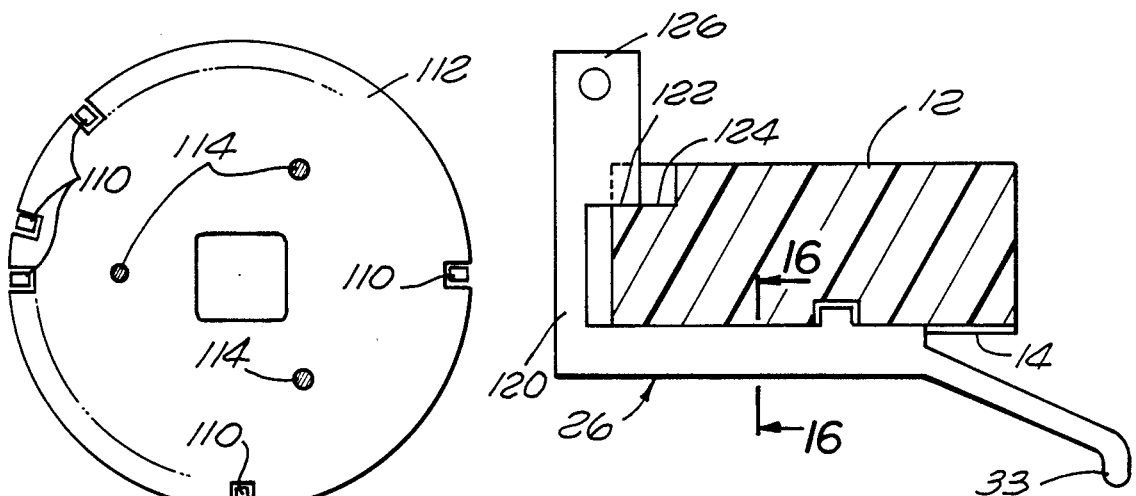
FIG. 14
FIG. 15
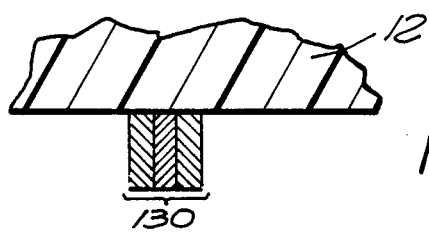
FIG. 16

PROBE CARD FOR INTEGRATED CIRCUIT CHIP

This invention relates to probe cards for testing the operativeness of integrated circuit chips. The invention particularly relates to probe cards providing a large number of probes on the probe cards in a precise configuration with predictable characteristics.

Integrated circuit chips are manufactured in increasing quantities to perform a variety of tasks in a wide number of different fields including data processing, data communications and digital computer. With the progression of time, the integrated circuit chips have become increasingly complex. For example, initially the integrated circuit chips may have had only a few pads (or terminals) for connection to terminals external to the chip. Now there are now often hundreds of pads (or terminals) on a chip as a result of increased circuit complexity.

Probe cards have been provided for testing the operativeness of integrated circuit chips. The probe cards have a plurality of probes (or electrical leads) on a dielectric substrate. Each of the probes is disposed on the dielectric substrate to contact an individual one of the pads (or terminals) on the chip at one end of such probe. The other end of the probe engages an individual lead on a printed circuit board These board leads are in turn connected to circuitry adapted to test the operativeness of the circuitry on such chip The different probes on the probe card have to be precisely positioned relative to one another so that the contacts at the ends of the probes lie in the same horizontal plane and at positions for engaging the associated pads on the chip.

In view of the above, the probes have had to be assembled on the probe card manually. Only people with great manual dexterity have been able to assemble the probes on the probe cards, particularly when hundreds of probes have to be assembled on the probe cards. This has caused the price of probe cards to become quite high. For example, prices as high as Twenty Five Dollars ($25) per probe are now often charged for each probe card. For a probe card having four hundred (400) probes, the price for a probe card can accordingly be as high as Ten Thousand Dollars ($10,000). Furthermore, as long as a week or more has been required to make a single probe card. An additional problem is that no two (2) probe cards are ever alike even when they are made to test different units of the same integrated circuit chip. Because of this, a test of different units of the same integrated circuit chip by different probe cards of identical design may not produce the same results.

The problems discussed in the previous paragraphs have been known for some time. The problems have been addressed with increasing intensity through the years as the integrated circuit chips have become increasingly complex. In spite of this, the problem still exists. Probe cards still are made manually. The prices for the probe cards remain high. Deliveries of probe cards are often scheduled with long lead times. And probe cards of identical design do not have identical characteristics.

In one embodiment of the invention, a probe card provides an interconnection between pads on an integrated circuit chip and leads on a printed circuit board to test the chip operability. The card includes a dielectric substrate having a substantially planar surface and at least one channel disposed in such surface in a particular direction.

Electrically conductive material is disposed in the channel to contact a conductive, preferably resilient, probe having a first portion disposed in the channel in abutting relationship with the planar surface on the support. Detents are provided in mating relationship in the channel and on the probe to position the probe precisely in the channel.

A second probe portion extends from the first portion at an angle to the first portion. A probe tip is at the end of the second portion to contact a pad on the chip. Additional detents may be provided on the support, either or both (a) in or (b) displaced from the channel and on the first portion of the probe to facilitate the precise positioning of the probe in the particular direction.

A first electrical contact may be disposed on the planar surface of the support to engage a second electrical contact on the second portion of the probe when the probe tip engages the chip pad with a particular force. The probe may be extended between the planar and opposite surfaces of the probe to provide a connector terminal for passing large currents through the probe. A spring terminal may also be coupled to the support to engage the probe and an associated lead on the board at opposite ends.

In the drawings:

FIG. 1 is a fragmentary exploded perspective view of a probe card constituting one embodiment of the invention, an integrated circuit chip and a printed circuit board for providing for a testing by the probe card and the printed circuit board of the operability of the integrated circuit chip;

FIG. 2 is an enlarged sectional view in elevation of the probe card, integrated circuit chip and printed circuit board shown in FIG. 1;

FIG. 3 is an enlarged fragmentary sectional view, inverted relative to FIG. 2, of a dielectric substrate and a probe included in the probe card shown in FIGS. 1 and 2;

FIG. 4 is a plan view of the probe shown in FIG. 3;

FIG. 12 is an enlarged fragmentary plan view of the embodiment shown in FIG. 11;

FIG. 13 is an enlarged fragmentary, partially exploded, sectional view in elevation of a probe card constituting an additional embodiment of the invention;

FIG. 14 is a schematic plan view of the embodiment shown in FIG. 13;

FIG. 15 is an enlarged fragmentary sectional elevational view of a probe card constituting a still further embodiment of the invention; and FIG. 16 is an enlarged fragmentary side elevational view of the embodiment shown in FIG. 15.

Figure 5:
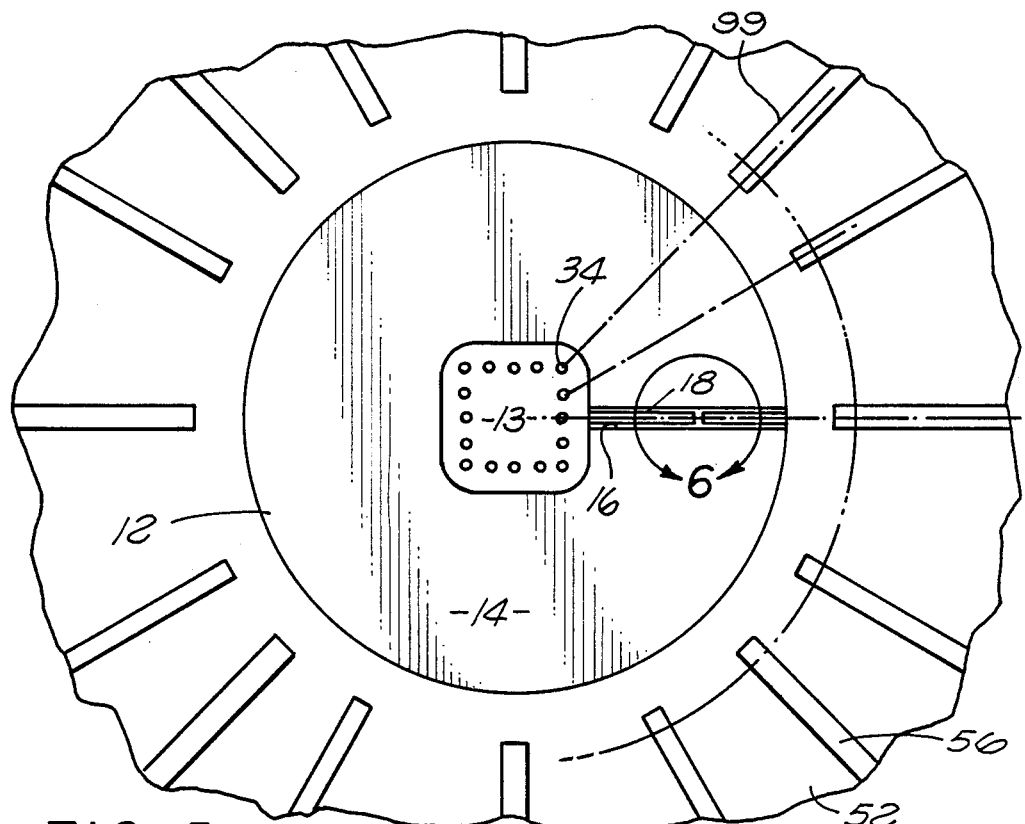
FIG. 5 is an enlarged fragmentary plan view of the integrated circuit chip, the dielectric substrate and the probe centerlines shown in the previous Figures.
Figure 6:
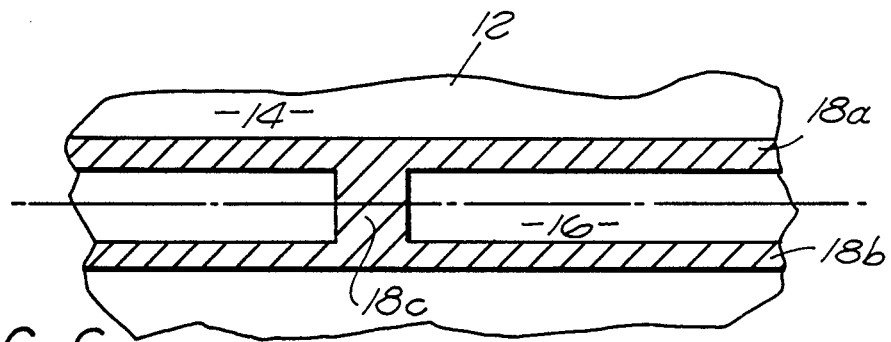
FIG. 6 is an enlarged fragmentary plan view of the dielectric substrate shown in the previous Figures and further shows a channel in the dielectric substrate for receiving one of the probes and a conductive layer in the channel for contacting the probe.
Figure 7:
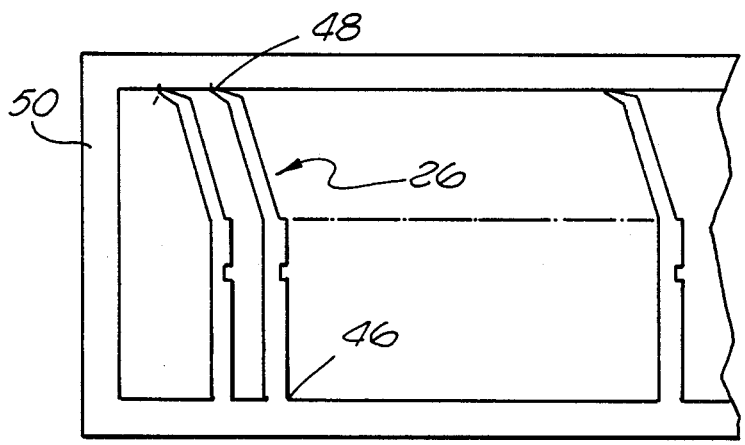
FIG. 7 is a plan view illustrating an intermediate step in the method of forming the probes shown in the previous Figures.

In the embodiment of the invention shown in FIGS. 1–6, a probe card generally indicated at 10 is provided. The probe card 10 includes a substrate 12 made from a suitable dielectric material well known in the art. An opening 13 (FIGS. 1 and 2) is provided in the dielectric substrate 12 at a central position in the substrate. The substrate 12 has a planar surface 14 in which relatively shallow channels 16 are disposed in a linear direction. The channels 16 may be closely spaced relative to one another on the surface 14 of the dielectric substrate 12.

A thin layer 18 (FIG. 6) of a conductive material such as gold or copper is disposed on the bed of the channels 16. The thin layer 18 may be in the form of two (2) parallel tracks 18a and 18b joined by a connecting portion 18c. The connecting portion 18c in each channel 16 is disposed on the surface of a detent such as a projection 20 in the channel. The projection 20 mates with detent such as a socket 22 in a first portion 24 of a probe generally indicated at 26. It will be appreciated that the detents can be reversed such that the detent in channels 16 constitute projections and the detents on the probes 26 constitute sockets. The probe 26 may be made from a suitable material, such as beryllium copper, preferably having resilient properties.

The first portion 24 (FIG. 3) of each probe 26 is disposed in the associated channel 16 in abutting relationship with the conductive layer 18 in the bed of the channel. A retaining material such as an epoxy 28 may be disposed in the channel 18 to fixedly position the first portion 24 of the probe 26 in the channel. The epoxy 28 may also be used to level each probe 26 and to dispose each probe at the same level as the other probes.

The probe 26 also has a second portion 30 which extends from the first portion 24 at a particular angle, such as an angle φ, to the planar surface 24 of the substrate 12. A third portion 32 shaped to define a probe tip extends at a particular angle, such as an angle 0, from the second portion 30. Each probe tip 32 is disposed as at 33 engage an individual one of the pads 34 on an integrated circuit chip, generally indicated at 36, which is to be tested in conjunction with the probe card 10. The probe tip 32 is disposed at a position closer to the center of the substrate than the periphery of the opening 13 in the substrate.

A spacer 40 made from a dielectric material may be disposed on the probes 26 and may be thin and flat. A thin layer 42 made from an electrically conductive material may be disposed on the spacer 40 to serve as a ground plane. The layer 42 tends to minimize any capacitive effects in the probe assembly. A thin layer 44 made from an electrically conductive material such as copper may also provided to serve as a ground plane. The layer 44 may be disposed on the surface of the dielectric substrate 12 opposite the planar surface 14. The layer 44 also operates to minimize capacitive effects in the probe assembly.

The probes 26 may be formed from a thin sheet 45 of a suitable material such as beryllium copper. The probes may be attached at their opposite ends 46 and 48 to a border 50. The probes may be cut from the border 50 at the ends 46 and may be etched from the borders 50 at the ends 48 as by chemical milling By chemically etching the ends 48, the ends 48, and particularly the portions 32 and the tips 33, can be made precise.

The dielectric substrates 12 may be suitably attached to a printed circuit board generally indicated at 52 (FIGS. 1 and 2). The printed circuit board 52 may be made in a conventional manner from a suitable dielectric material and may be provided with a central opening 54 corresponding in position to the opening 13 in the dielectric substrate 12. A plurality of electrically conductive leads 56 are disposed on the surface of the printed circuit board 52 in abutting relationship to the dielectric substrate 12. The leads 56 contact the ends of the probes 26 opposite the probe tips 34. The leads 56 are in turn connected to electrical circuitry (not shown) for testing the integrated circuit chip 36 when the probe tips 32 engage the pads 34 on the integrated circuit chip.

The probe card 10 described above has certain important advantages. The projections 20 in the channels 16 and the sockets 22 on the first portions 24 of the probes 26 cooperate to provide a precise positioning of the probe 26 relative to the planar surface 14. The position of the projection 20 is located by design at a fixed length from the pads 34 in the direction of a line from the pad 34 to a corresponding point 99 (FIG. 5) and the trace 56 to which the pad 34 is to be electrically connected. The portions 30 and 32 are precisely positioned in the planar and angular directions relative to the socket 22 of the probe 26. Because of this, the probe tips 33 lie in a common plane displaced at a particular distance from the planar wall 14 of the dielectric substrate 12, and at positions corresponding to pads 34. This causes the probe tips 33 to exert substantially equal forces on the pads 34 of the integrated circuit chips 36.

The planar disposition of the spacers 40 and the conductive layers 42 on the probes 26 also offers significant advantages, particularly at high frequencies. The conductive layer 42 provides a ground plane and cooperates with the probes 26 at the high frequencies to define what may be considered to be a transmission line similar in concept to what is known as a microstrip or stripline. The ground plane 46 provides a similar effect.

Figure 8:
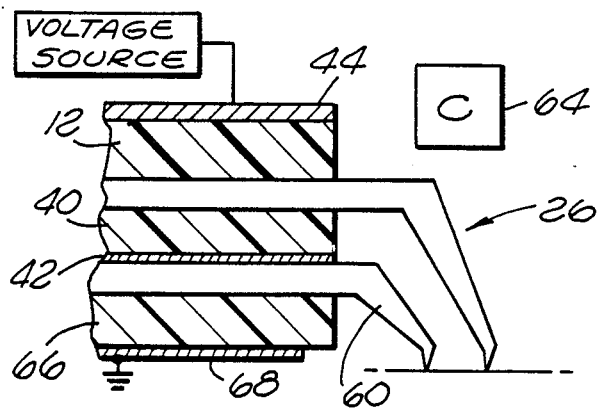
FIG. 8 is an enlarged fragmentary sectional view of a probe card constituting another embodiment of the invention.

FIG. 8 illustrates another embodiment of the invention. In this embodiment, the dielectric substrate 12, the probe 26 and the spacer 40 may be provided. Channels corresponding to the channels 16 may be provided in the spacer 40 and probes generally indicated at 60 may be provided in these channels in a manner similar to that described above for the relationship between the probes 26 and the channels 16. The probes 60 may be constructed in a manner similar to that described except that the probe tips in the probes 60 extend at a different angle or height than the probe tips for the probes 26. In this way, the probe tips for the probes 60 are able to contact discrete elements associated with the integrated circuit chip 36 and the probe tips for the probes 26 are able to contact the pads 34 on the integrated circuit chip (the discrete elements and the integrated circuit chip forming hybrid circuits). A dielectric spacer 66 is disposed on the probes 60 and an electrical ground plane 68 is disposed on the spacer 66.

The arrangement described above and shown in FIG. 8 has certain important advantages in addition to those described in the previous paragraph. By providing the probes 26 and 60 in two separate banks, the spacing between the probes 26 in one bank and between the probes 60 in the other bank can be increased while still providing contacts to a large number of pads 34 and discrete elements. This facilitates precise and controlled contacts between the probes 26 and the pads 34 and between the probes 60 and the discrete elements.

Figure 9:
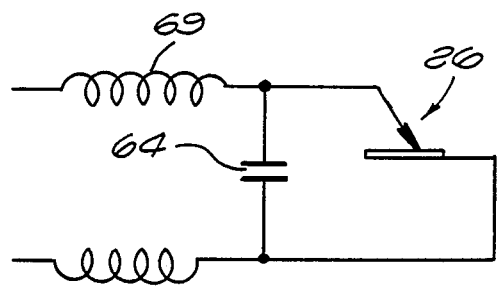
FIG. 9 is a schematic circuit diagram of particular electrical elements in the embodiment shown in FIG. 8.

The conductive layer 44 in the embodiment shown in FIG. 8 may be connected to a source 46 of a positive voltage and the conductive layer 68 may be grounded. A capacitance 64 may be disposed adjacent to the probes such as the probes 26 and may be connected to the adjacent probe. A circuit such as shown in FIG. 9 may be accordingly produced. In this circuit, the capacitance 64 by-passes the inductance (such as an inductance 69) in the associated probe so that this inductance does not affect the operation of the circuit. As will be appreciated, this inductance may be relatively low because it occurs essentially only in the second portion 30 of the probe.

Figure 10:
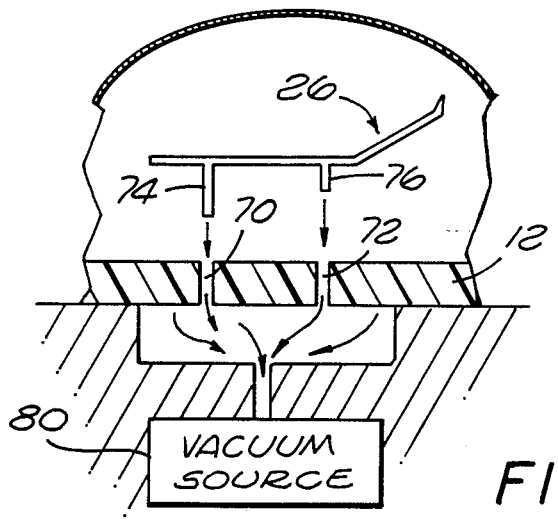
FIG. 10 is a fragmentary exploded elevational view of a probe card constituting still another embodiment of the invention and of apparatus for facilitating the assembly of different elements in such probe card.

FIG. 10 illustrates another embodiment of the invention. In this embodiment, the dielectric substrate 12 is provided with holes 70 and 72 and the probe 26 may be provided with fingers 74 and 76 which are respectively adapted to be disposed in the holes 70 and 72 in relatively close fit in the holes to enhance the precise positioning of the probe 26 in the channel 16. To dispose the fingers 74 and 76 respectively in the holes 70 and 72 during the manufacture of the probe assembly, a source of vacuum 80 may be provided to move the fingers along the substrate into mating relationship with the holes. The finger 74 may be provided with a longer length than the finger 76 so that the finger 74 can be initially disposed in the hole 70 and the finger 76 can be thereafter disposed relatively easily in the hole 72. The fingers 74 and 76 and the holes 70 and 72 may be in addition to, or in place of, the projection 20 and the socket 22 in each probe assembly in the embodiment shown in FIGS. 1–6 and described above.

Figure 11:
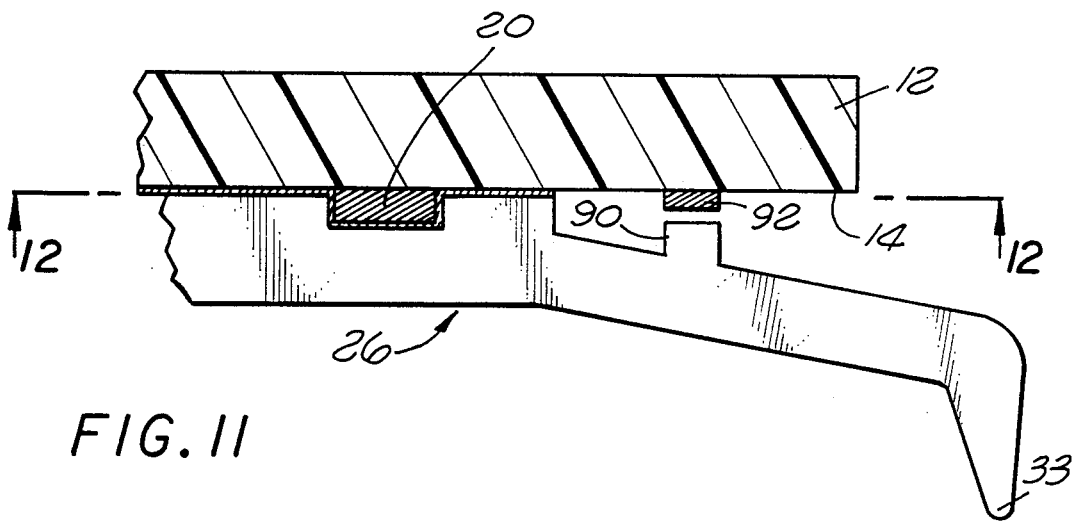
FIG. 11 is an enlarged fragmentary elevational view of a probe card constituting a further embodiment of the invention.

As will be appreciated, the second portion 30 of the probe 26 has resilient properties. These resilient properties are precisely controlled because the width and thickness of the probe 26 and the length and angular spacing of the second portion 30 and the third portion 32 of the probe 26 are precisely controlled by virtue of chemical milling. Because of this, when the probe tip 33 on the probe 26 contacts the associated pad 34 on the integrated circuit chip 36 the second portion 30 on the probe 26 becomes deflected through a particular distance. This distance may be sufficient to cause a contact 90 on the second probe portion to engage a contact 92 on the planar surface 14 of the dielectric substrate 12 in FIG. 11. The contacts 90 and 92 may constitute a switch which control various functions during the testing of the operability of the integrated circuit chip 36. A lead 94 in FIG. 12 extends from the contact 92 to provide an electrical connection with electrical circuitry (not shown) for testing the operability of the printed circuit chip 36.

FIGS. 13 and 14 illustrate another embodiment of the invention. In this embodiment, a spring contact generally indicated at 100 may be made from a suitable resilient material such as beryllium copper as by chemical milling techniques. The spring contact 100 may be provided with a portion 102 which is disposed against the base surface of the channel 16 in electrical contact with the electrically conductive material 18 in the channel.

A portion 104 of the spring contact 100 extends along the dielectric substrate 12 to the other surface of the dielectric substrate. A portion 106 then extends along the other surface of the substrate 12 and a portion 108 then flares upwardly from the portion 106 in a looped relationship to define a contact portion 110 with spring-like properties.

The contact portion 110 is disposed in engagement with an associated one of the electrically conductive leads 56 on the printed circuit board 52 to define a switch. The printed circuit board 52 is disposed in a fixed and spaced relationship to the dielectric substrate 12 by providing a ring 112 made from a suitable dielectric material, adhering the ring 112 to the dielectric substrate 12 and extending a fastening member 114 through the ring and the printed circuit board. The fastening member may be externally threaded at its shank end to receive a nut 116.

FIGS. 15 and 16 illustrate a further embodiment of the invention. In this embodiment, the probe 26 is extended as at 120 in the direction of the thickness of the dielectric substrate 12. The probe 26 is then stepped as at 122 so as to be supported on a ridge 124 on the surface of the dielectric substrate 12 opposite the planar surface 14. The probe 26 is then stepped from this opposite surface as at 126. The portion 126 may constitute a terminal for introducing a current of a large amplitude to the probe tip 33. To facilitate the flow of this large current (as large as several amperes), the probe 26 may be laminated as at 130 to enlarge the cross sectional area of the probe.

The probe cards described above and shown in the drawings has certain important advantages. They provide for a precise positioning of each probe 26 relative to the associated pad 34 on the integrated circuit chip. They also provide for the imposition of a precise and controlled force by each probe tip 33 on the associated pad 34. This insures that precise tests can be made by the testing system including the probe card 10 and the printed circuit board 52 to determine the operability of the integrated circuit chip 36. The probe cards further provide for a precise positioning of individual probes relative to discrete elements associated with the integrated circuits (in hybrid circuits) as well as to the pads on the chip. It provides for a simple manufacture and assembly of the probe cards even while obtaining the precisely controlled testing results. It further provides for the inclusion of switching circuitry in the testing system, such switching circuitry being included in the probe card for individual probes. It also provides for the provision of probes in the probe cards with the ability to pass large magnitudes of current. The probe cards also provide for a minimizing of inductive and capacitive effects resulting from the disposition of the probes on the dielectric substrates in the probe cards.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

I claim:

1. A probe card for interconnection between pads on an integrated circuit chip and leads on a printed circuit board to determine the operability of the integrated circuit, including, a dielectric substrate having a substantially planar surface and having at least one channel in the planar surface, there being a detent in the channel at a particular position in the channel, electrically conductive material disposed in the channel, and an electrically conductive probe having a first portion disposed in the channel, the first portion having a detent for mating with the detent in the channel, the electrically conductive probe having at least a second portion extending from the channel with a probe tip at the end of such portion for engagement with a particular one of the pads on the integrated circuit chip.

2. A probe card as set forth in claim 1 wherein
means are disposed in the channel for adhering the probe card in the channel with the probe card in contact with the electrically conductive material in the channel.

3. A probe card as set forth in claim 1, including,
dielectric material covering the probe card and electrically conductive material disposed on the dielectric material.

4. A probe card as set forth in claim 3 wherein
means are disposed in the channel for adhering the probe card in the channel with the probe card in contact with the electrically conductive material in the channel and wherein the second portion of the probe extends from the planar surface of the substrate at a particular angle to the planar surface.

5. A probe card for interconnection between pads on an integrated circuit chip and leads on a printed circuit board to determine the operability of the integrated circuit chip, including,
a dielectric substrate having a substantially planar surface and having at least one channel linearly disposed in the planar surface,
a detent disposed in the channel at a particular position in the channel,
electrically conductive material disposed in the channel along at least a portion of the length of the channel, and
a probe disposed in the channel and having first, second and third portions,
the first portion of the probe being disposed in the channel and having a detent at a particular position along the length of the first portion, the detent on the first portion of the probe mating with the detent in the channel,
the second portion of the probe being integral with the first portion of the probe and extending from the first portion at a first particular angle with respect to the planar surface of the dielectric substrate, and
the third portion of the probe including a probe tip and extending at a second particular angle with respect to the planar surface of the dielectric substrate.

6. A probe card as set forth in claim 5, including,
the probe being planar and being made from a resilient material and
the channel having a planar surface to receive the planar probe.

7. A probe card as set forth in claim 5, including,
means disposed in the planar surface of the channel to facilitate the disposition of the probe in the channel with the detents in mating relationship, and
means disposed on the probe for cooperating with the last mentioned means to facilitate the disposition of the probe in the channel with the detents in mating relationship.

8. A probe card as set forth in claim 5, wherein the detent means on the dielectric substrate constitutes a projection and the detent means on the probe constitutes a socket for receiving the projection.

9. A probe card as set forth in claim 5 wherein
the facilitating means in the planar surface of the channel includes at least one aperture and the facilitating means on the probe includes at least one finger for disposition in the aperture.

10. A probe card as set forth in claim 9, including,
the wall in each of the channels substantially parallel to the planar surface of the substrate and each of the probes being provided with a planar configuration.

11. A probe card as set forth in claim 9, including,
the detent means on one of each channel and the associated probe being a projection and the detent means on the other one of each channel and the associated probe being a socket for mating with the projection.

12. A probe card as set forth in claim 9, including,
the probe being made from a resilient material,
a plurality of first contact means each associated with an individual one of the probes and disposed on the planar surface of the dielectric substrate at a position displaced from the associated channel, and
a plurality of second contact means disposed on the second portion of an individual one of the probes to engage the associated one of the first contact means when the probe tip means of such probe engages an associated one of the pads on the integrated circuit chip.

13. A probe card for interconnection between pads on an integrated circuit chip and leads on a printed circuit board to determine the operability of the integrated circuit chip, including,
a dielectric substrate having a planar surface, there being a plurality of channels in the planar surface, each of the channels being defined by at least one wall extending linearly on the dielectric substrate in spaced relationship to one another and terminating at its inner end at a position displaced from the center of the planar surface to contact an individual one of the pads on the integrated circuit chip,
there being electrically conductive material on at least one of the walls defining each of the channels,
a plurality of detents each disposed in an individual one of the channels at a particular position along the length of such channel,
a plurality of probes each disposed in an individual one of the channels and each having a first portion with a detent for mating with the detent in such individual channel, the first portion of each of the probes having a particular length and being disposed in abutting relationship with the wall of the associated channel along such particular length,
each of the probes having a second portion extending away from the planar surface of the dielectric substrate at a first particular angle relative to the planar surface of the dielectric substrate, and
each of the probes having a probe tip portion extending from the second portion of such probe at a second particular angle relative to the planar surface of the dielectric substrate.

14. A probe card for interconnection between pads on an integrated circuit chip and leads on a printed circuit board to determine the operability of the integrated circuit chip, including, a dielectric substrate having a substantially planar surface and having at least one channel disposed in the planar surface in a particular direction, a probe having first, second and third portions, the first portion of the probe being disposed in the channel in abutting relationship to the planar surface of the dielectric substrate, the second portion of the probe extending from the first portion of the probe at an angle relative to the planar surface of the dielectric substrate, the third portion of the probe extending from the second portion of the probe at an angle relative to the planar surface of the dielectric material and relative to the second portion of the probe and defining a probe tip for engaging one of the pads on the integrated circuit chip, and detent means disposed at a particular position in the channel in the planar substrate and providing a cooperative relationship between the channel and the probe to produce a controlled positioning of the probe in the particular direction, the detent means including a projection on an individual one of the channel and the probe and a socket on the other one of the channel and the probe to mate with the projection.

15. A probe card for interconnection between pads on an integrated circuit chip and leads on a printed circuit board to determine the operability of the integrated circuit chip, including, a dielectric substrate having a substantially planar surface and having at least one channel disposed in the planar surface in a particular direction, a probe having first, second and third portions, the first portion of the probe being disposed in the channel in abutting relationship to the planar surface of the dielectric substrate, the second portion of the probe extending from the first portion of the probe at an angle relative to the planar surface of the dielectric substrate, the third portion of the probe extending from the second portion of the probe at an angled relative to the planar surface of the dielectric material and the second portion of the probe and defining a probe tip for engaging one of the pads on the integrated circuit chip, first detent means on the probe, first detent means disposed at a particular position in the channel in the planar substrate and providing a cooperative relationship with the first detent means on the probe to produce a controlled positioning of the probe in the particular direction, additional detent means disposed in the channel of the dielectric substrate and on the probe and displaced in the particular direction from the first detent means on the probe and in the channel and providing a cooperative relationship between the channel and the probe to facilitate the production of a controlled positioning of the probe in the particular direction.

16. A probe card as set forth in claim 15 wherein the additional means includes cooperating detents in the channel and on the first portion of the probe for providing the cooperative relationship between the channel and the probe to facilitate the production of the controlled positioning of the probe in the particular direction.

17. A probe card as set forth in claim 14 wherein a spacer made from a dielectric material is disposed on the probe and electrically conductive material is disposed on the spacer in spaced relationship to the probe to define a conductive reference plane.

* * * * *